(12) United States Patent
Koller et al.

(10) Patent No.: US 7,772,693 B2
(45) Date of Patent: Aug. 10, 2010

(54) PANEL, SEMICONDUCTOR DEVICE AND METHOD FOR THE PRODUCTION THEREOF

(75) Inventors: Adolf Koller, Regensburg (DE); Horst Theuss, Wenzenbach (DE); Ralf Otremba, Kaufbeuren (DE); Josef Hoeglauer, Munich (DE); Helmut Strack, Munich (DE); Reinhard Ploss, Munich (DE)

(73) Assignee: Infineon Technologies AG (DE)

( * ) Notice: Subject to any disclaimer, the term of this patent is extended or adjusted under 35 U.S.C. 154(b) by 511 days.

(21) Appl. No.: 11/677,774

(22) Filed: Feb. 22, 2007

(65) Prior Publication Data

US 2008/0191359 A1     Aug. 14, 2008

(30) Foreign Application Priority Data

Feb. 9, 2007    (DE) .................. 10 2007 007 142

(51) Int. Cl.
*H01L 23/34*    (2006.01)

(52) U.S. Cl. ...................... 257/724; 257/723

(58) Field of Classification Search .......... 257/723, 257/724, 691, 508, 513
See application file for complete search history.

(56) References Cited

U.S. PATENT DOCUMENTS

| | | | | |
|---|---|---|---|---|
| 4,348,253 | A | 9/1982 | Subbarao et al. ............ | 156/643 |
| 5,465,009 | A | 11/1995 | Drabik et al. | |
| 5,637,922 | A | 6/1997 | Fillion et al. | |
| 5,705,848 | A | 1/1998 | Bayerer ...................... | 257/500 |
| 5,786,636 | A * | 7/1998 | Takahashi ................... | 257/723 |
| 5,939,755 | A * | 8/1999 | Takeuchi et al. ............. | 257/347 |
| 6,133,634 | A | 10/2000 | Joshi .......................... | 257/738 |
| 6,306,680 | B1 | 10/2001 | Fillion et al. | |
| 6,582,990 | B2 | 6/2003 | Standing ..................... | 438/106 |
| 6,624,522 | B2 | 9/2003 | Standing et al. ............. | 257/782 |
| 6,677,669 | B2 | 1/2004 | Standing ..................... | 257/685 |
| 6,767,820 | B2 | 7/2004 | Standing et al. ............. | 438/614 |
| 6,890,845 | B2 | 5/2005 | Standing et al. ............. | 438/614 |
| 7,271,470 | B1 * | 9/2007 | Otremba ..................... | 257/666 |
| 7,304,372 | B2 * | 12/2007 | Hu et al. ..................... | 257/678 |

(Continued)

FOREIGN PATENT DOCUMENTS

DE    10308928    11/1995

(Continued)

OTHER PUBLICATIONS

U.S. Appl. No. 11/421,297 entitled *Electronic Component having at least two Semiconductor Power Devices*, (54 pages), May 31, 2006.

(Continued)

*Primary Examiner*—S. V Clark
(74) *Attorney, Agent, or Firm*—Banner & Witcoff, Ltd.

(57) ABSTRACT

A panel has a baseplate with an upper first metallic layer and a multiplicity of a vertical semiconductor components. The vertical semiconductor components in each case have a first side with a first load electrode and a control electrode and an opposite second side with a second load electrode. The second side of the semiconductor components is in each case mounted on the metallic layer of the baseplate. The semiconductor components are arranged in such a way that edge sides of adjacent semiconductor components are separated from one another. A second metallic layer is arranged in separating regions between the semiconductor components.

30 Claims, 8 Drawing Sheets

U.S. PATENT DOCUMENTS

| | | | |
|---|---|---|---|
| 2002/0027276 A1 | 3/2002 | Sakamoto et al. | |
| 2004/0021216 A1 | 2/2004 | Hosoya | |
| 2004/0061221 A1* | 4/2004 | Schaffer | 257/723 |
| 2006/0087026 A1 | 4/2006 | Cao et al. | 257/706 |

FOREIGN PATENT DOCUMENTS

| | | |
|---|---|---|
| DE | 196 12 514 A1 | 5/1997 |
| EP | 0461316 | 12/1991 |

OTHER PUBLICATIONS

U.S. Appl. No. 11/424,150 entitled *Electrically Conductive Connection, Electronic Component and Method for their Production*, (55 pages), Jun. 14, 2006.

Examination Report for DE102007007142.8-33 dated Oct. 10, 2007, 4 pages.

* cited by examiner

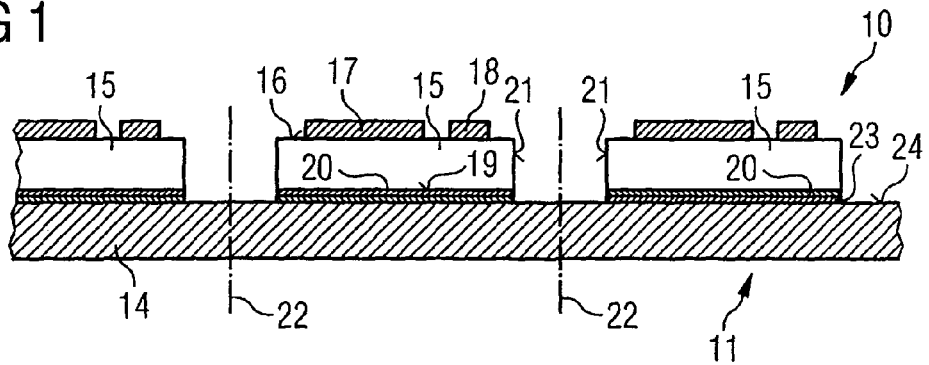
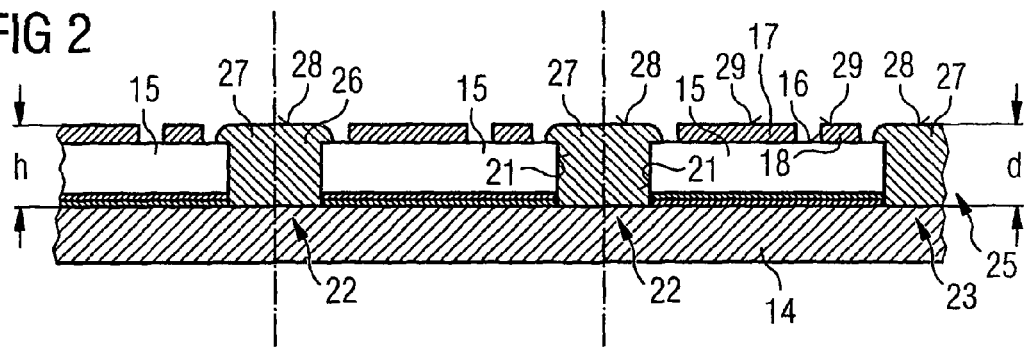
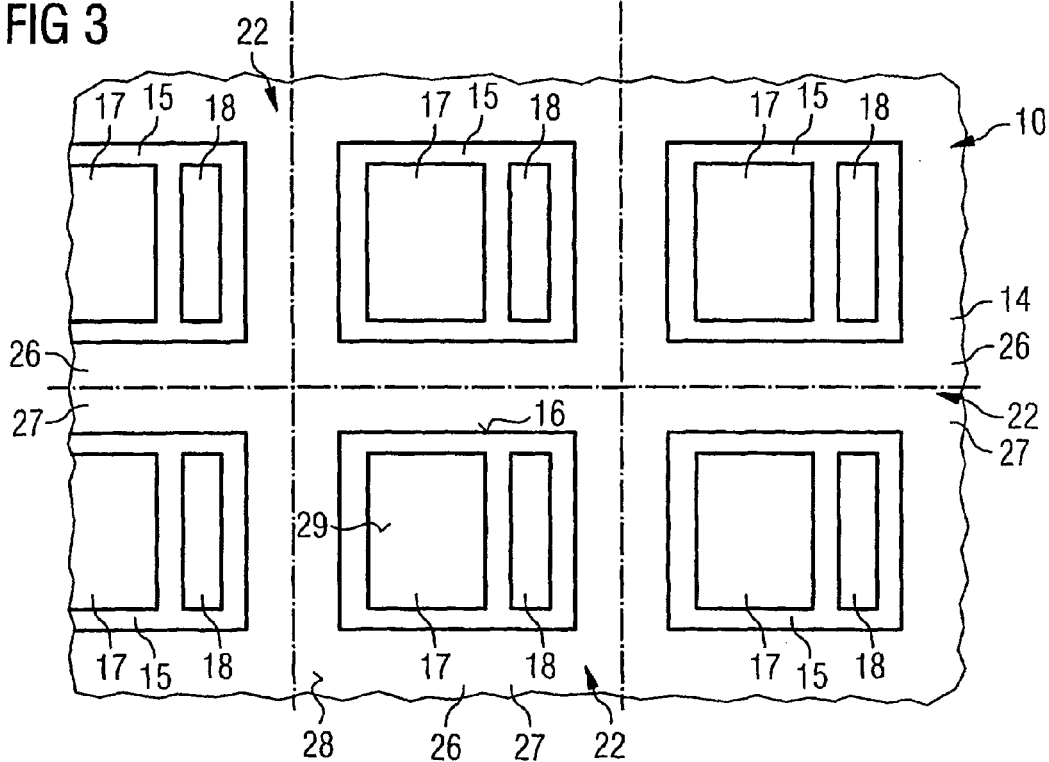

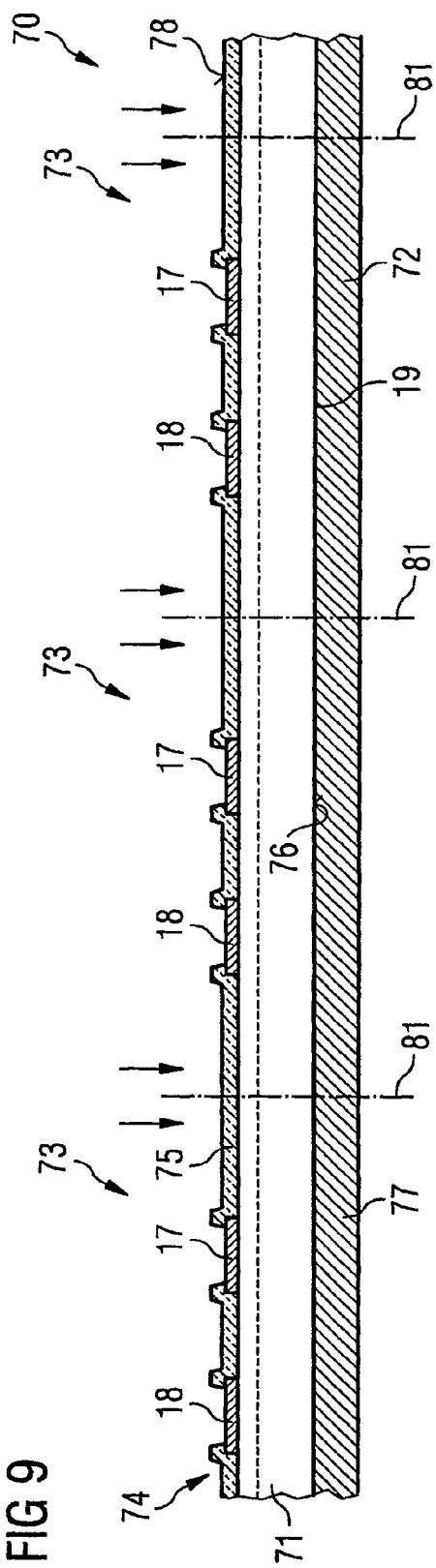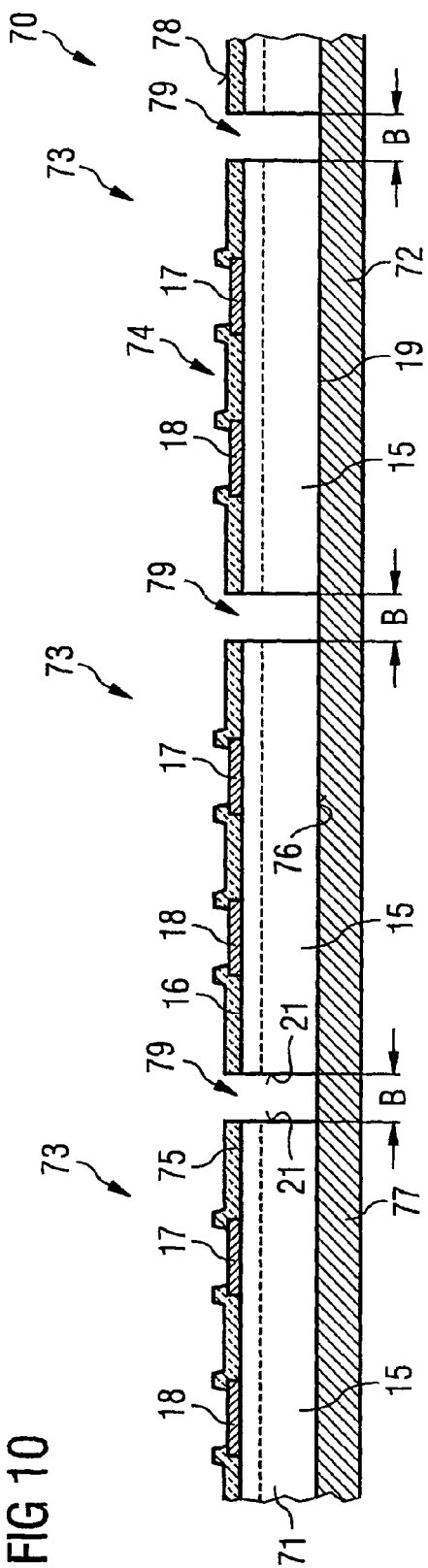

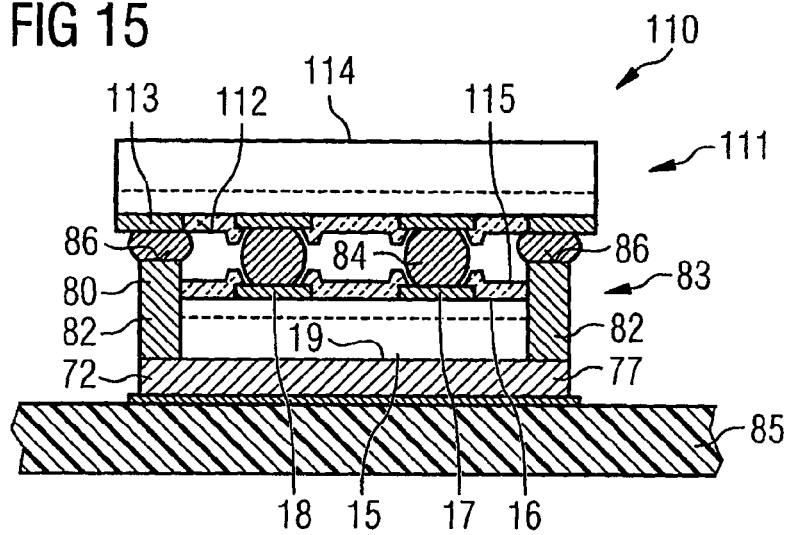
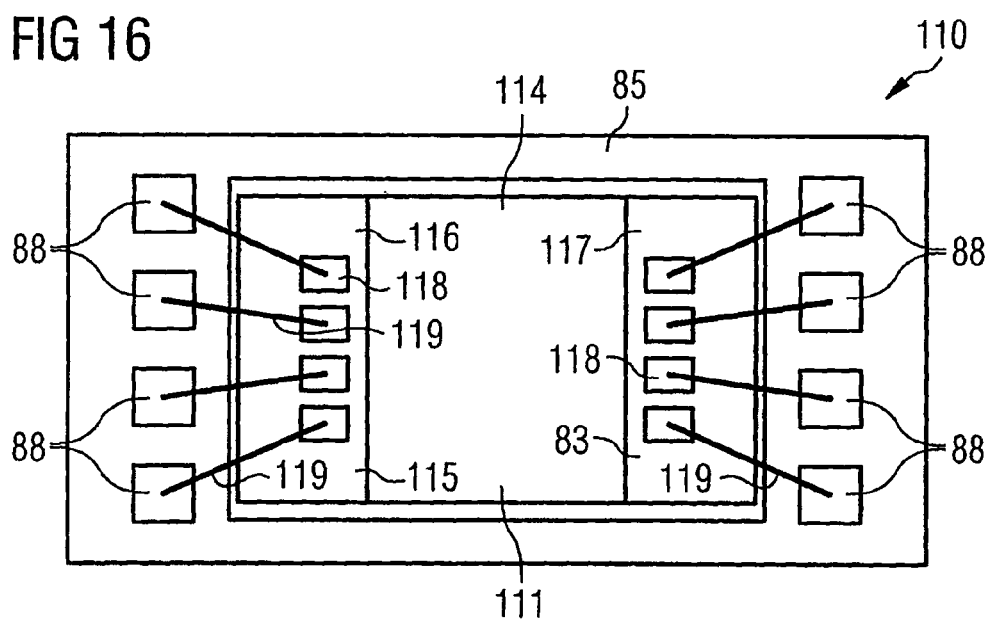
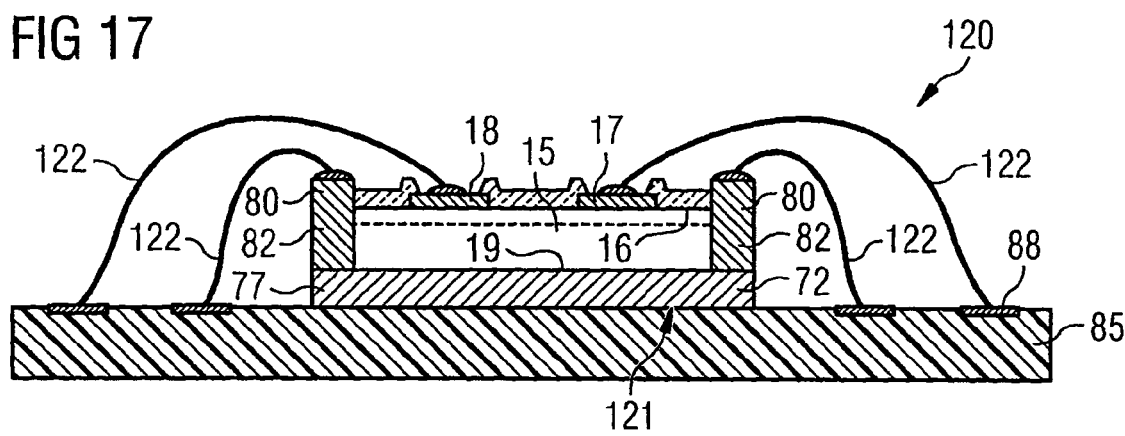

PANEL, SEMICONDUCTOR DEVICE AND METHOD FOR THE PRODUCTION THEREOF

CROSS-REFERENCE TO RELATED APPLICATIONS

This application claims priority to German application number 10 2007 007 142.8 filed Feb. 9, 2007, the contents of which is hereby incorporated by reference in its entirety.

TECHNICAL FIELD

The application relates to a panel, a semiconductor device and method for the production thereof.

BACKGROUND

Semiconductor components, such as semiconductor chips, are normally used in the form of a semiconductor device. The semiconductor device normally provides an internal rewiring extending between the doped regions of the semiconductor material of the semiconductor component and the external contacts of the semiconductor device in order to simplify the electrical access to the semiconductor chip. Furthermore, the semiconductor device may have a housing that protects the semiconductor component against damage.

The internal rewiring and the housing influence the electrical power and thermal capacity, the so-called performance of the semiconductor device.

SUMMARY

According to an embodiment, a panel may comprise a baseplate with an upper first metallic layer and a multiplicity of a vertical semiconductor components. The vertical semiconductor components in each case may comprise a first side with a first load electrode and a control electrode and an opposite second side with a second load electrode. The second side of the semiconductor components is in each case mounted on the metallic layer of the baseplate. The semiconductor components can be arranged in such a way that edge sides of adjacent semiconductor components are separated from one another. A second metallic layer can be arranged in separating regions between the semiconductor components.

According to a further embodiment, a method for the production of a panel may comprise the following features. A multiplicity of vertical semiconductor components are provided, wherein the semiconductor components in each case comprise a first side with a first load electrode and a control electrode and an opposite second side with a second load electrode, wherein the second sides of the semiconductor components are arranged on a metallic layer in such a way that edge sides of adjacent semiconductor components are separated from one another by means of separating regions, and the second sides are electrically connected to the metallic layer. At least one metal is deposited onto the metallic layer in the separating regions between the semiconductor components, with the result that the edge sides of the semiconductor components are covered by the deposited metal.

BRIEF DESCRIPTION OF THE DRAWINGS

FIG. 1 shows a cross section of a panel with a multiplicity of semiconductor components, FIG. 2 shows a cross section of the panel from FIG. 1 with rear side rewiring, FIG. 3 shows a plan view of the panel from FIG. 2, FIG. 9 shows a cross section of a panel according to a fifth embodiment, FIG. 10 shows the production of a multiplicity of semiconductor components from the panel from FIG. 9, FIG. 15 shows a semiconductor device according to a ninth embodiment, FIG. 16 shows a plan view of the semiconductor device from FIG. 15, and FIG. 17 shows a semiconductor device according to a tenth embodiment.

DETAILED DESCRIPTION

Figure 7:
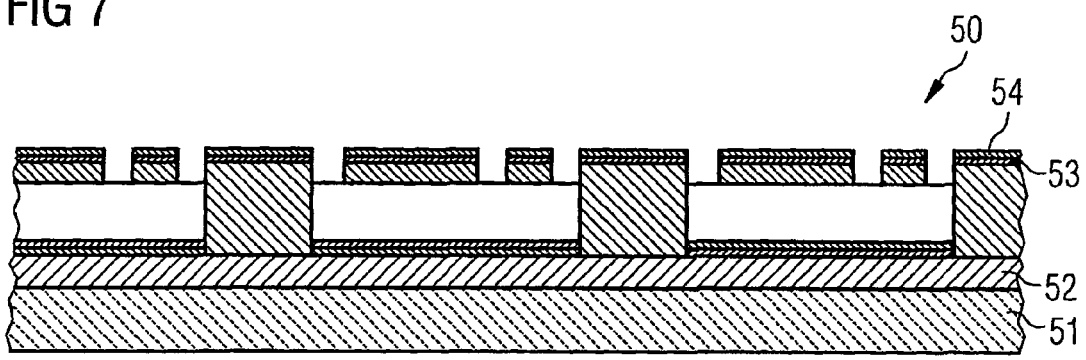
FIG. 7 shows a cross section of a panel according to a third embodiment.
Figure 8:
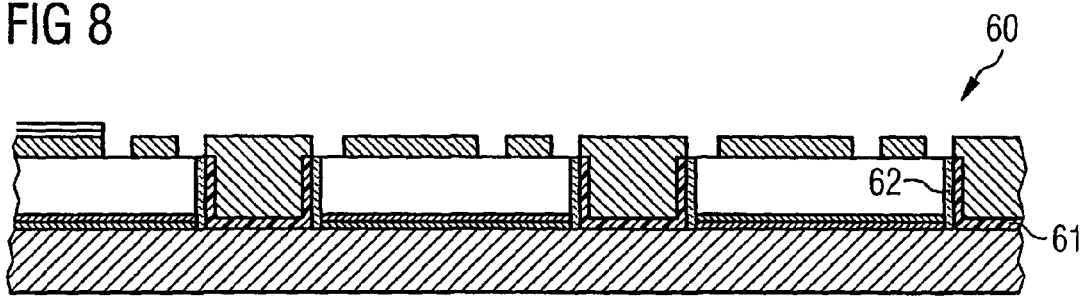
FIG. 8 shows a cross section of a panel according to a fourth embodiment.

FIGS. 1 to 5 show the production of a panel 10, which is singulated in order to produce a plurality of semiconductor devices 11. FIGS. 6a and 6b in each case show a semiconductor device 12 produced by means of a panel. The semiconductor device 12 differs from the semiconductor device 11 through the arrangement of the external contact areas 13. FIGS. 7 and 8 in each case show a panel according to further embodiments.

Figure 11:
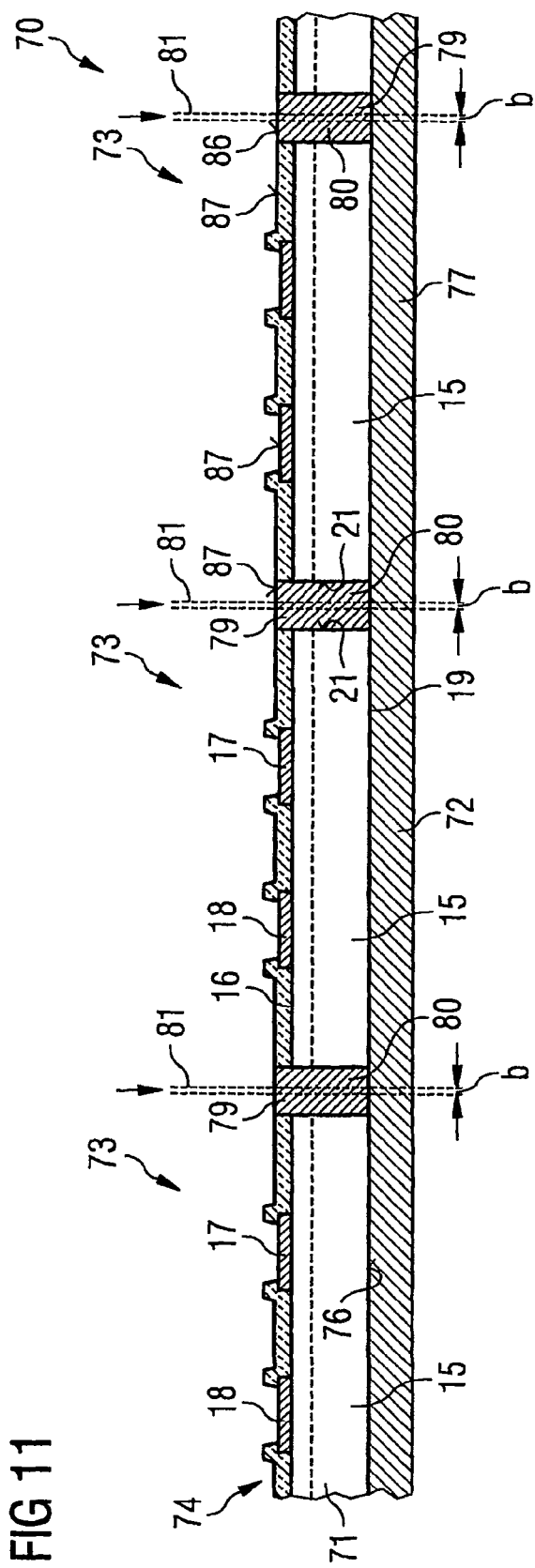
FIG. 11 shows the production of a rear side rewiring of the semiconductor components from FIG. 10.

FIGS. 9 to 11 show the production of a panel according to one embodiment and FIGS. 12 to 17 show semiconductor devices which can be produced by means of the panel from FIG. 11.

In the figures, identical elements are shown with the same reference symbol.

FIG. 1 shows a cross section of a panel 10 having a baseplate 14 in the form of a carrier 14 with an upper metallic layer and a multiplicity of semiconductor components 15. In this embodiment, the carrier 14 is a metallic plate, in particular a copper plate. In this embodiment, the semiconductor components 15 are in each case a vertical semiconductor component, in particular a vertical power transistor in the form of a vertical MOSFET (Metal Oxide Semiconductor Field Effect Transistor). The semiconductor component 15 may be an IGBT (Isolated Gate Bipolar Transistor) or a BJT (Bipolar Junction Transistor) or a diode. The semiconductor component 15 has a first side 16 with a first load electrode 17 and a control electrode 18 and an opposite second side 19 with a second load electrode 20. The electrodes 17, 18 and 20 in each case have the form of a contact area. The first load electrode 17 and also the second load electrode 20 are in each case large-area contacts. The control electrode is a small-area contact. The two electrodes 17, 18 on the first side 16 are electrically insulated from one another. In this embodiment, the first load electrode 17 is designated as source, the control electrode 18 is designated as gate and the second load electrode 20 is designated as drain, since the semiconductor component 15 is a MOSFET.

A multiplicity of the semiconductor components 15 are provided. The second side 19 of the semiconductor components 15 is arranged on the metallic surface 24 of the carrier 14 in such a way that the edge sides 21 of adjacent semiconductor components 15 are separated from one another by means of separating regions 22. The second side 19 is electrically connected to the metallic surface 24 of the carrier 14.

In this first embodiment, individual semiconductor components 15 are mounted onto the carrier 14. In particular, the second side 19 of the semiconductor components 15 is mounted on the upper metallic layer of the carrier 14. The semiconductor components 15 are arranged in such a way that the edge sides 21 of adjacent semiconductor components 15 are separated from one another by means of separating regions 22. The semiconductor components 15 are arranged in columns and rows, with the result that the separating regions 22 have sawing tracks. The sawing tracks are represented by a broken line in the figures.

The second side 19 or the second load electrode 20 of the semiconductor components 15 is mounted on the surface 24 of the copper plate 14 by means of a diffusion solder connection 23. In a further embodiment, the semiconductor components can be mounted onto the carrier by means of a soft solder connection.

In order to produce the diffusion solder connection 23, a layer of a diffusion solder is deposited on the second load electrode 19. In order to mount the semiconductor component 15 on the plate 14, the plate 14 is heated to a temperature lying above the melting point of the diffusion solder. The second side 19 of the semiconductor component 15 is pressed onto the surface of the carrier 14, said surface comprising copper. The diffusion solder melts and reacts with the material of the surface of the plate 14, intermetallic phases being formed. Said intermetallic phases have a higher melting point than the melting point of the diffusion solder. Consequently, the boundary between the second side 19 of the semiconductor component 15 and the plate 14 solidifies and forms the diffusion solder connection 23. Said diffusion solder connection thus has a higher melting point than the melting point of the diffusion solder. Consequently, further semiconductor components 15 can be mounted on the plate 14 without the diffusion solder connections 23 that have already been produced melting again. A multiplicity of semiconductor components 15 can thus be reliably mounted on the plate 14 piece by piece.

FIG. 2 shows a cross section of the panel 10 from FIG. 1 with rear side rewiring 25. In order to produce the rear side rewiring, at least one metal 26 is deposited onto the plate 14, in particular into the separating regions between the semiconductor components 15. The metal 26 may be copper or a copper alloy. The metal 26 is built up layer by layer and forms a layer 27 of the panel 10. The layer 27 is cohesively connected to the edge margins and edge sides of the semiconductor components 15. The deposition is carried out in such a way that the separating regions 22 are essentially filled by the deposited metal. This may be implemented by the setting of the deposition duration. The edge sides 21 of the semiconductor component 15 are sealed by the metal layer 27. Consequently, there is no need to use a plastic composition for protection against air and moisture.

The layer 27 is deposited in order to provide a rear side rewiring. The semiconductor components 15 are vertical components in which contact areas are arranged on two opposite sides 16, 19 of the component 15. A rewiring structure is provided for making contact with the two sides 16, 19 of the component 15, with the result that all the contact areas can be acted on from a single side of the semiconductor component 15. The layer 27 has at least one metal that is deposited directly on the surface 24 of the plate 14 and is electrically connected to the plate 14. The plate 14 is electrically connected to the second load electrode 19 by means of the diffusion solder connection 23. The second load electrode 19 can therefore be acted on electrically from the opposite side 16 of the semiconductor component 15 via the plate 14 and via the layer 27.

The layer 27 is built up layer by layer by the deposition until at least regions of the surface 28 of the layer 27 are essentially coplanar with the first load electrode 17 and with the control electrode 18, in particular until at least regions of the surface 28 of the layer 27 are essentially coplanar with the outer surface of the first load electrode 17 and the control electrode 18.

In this embodiment, the layer 27 is produced by means of electrodeposition. The potential of the electrolytic cell is connected to the plate 14. Consequently, the metal is deposited principally on the plate 14. Hardly any metal or even no metal is deposited onto the first load electrode 17 and the control electrode 18 during the deposition method.

In an embodiment that is not shown, the metal layer 27 is deposited with a thickness d that is greater than the height h of the semiconductor component 15. The surface 28 of the metal layer 27 lies above the outer surface 29 of the first load electrode 17 and the control electrode 18. This side of the panel 10 is then planarized. This may be carried out by grinding away, such as CMP (chemical mechanical polishing).

The panel 10 therefore has a plate 14 on which a metallic layer 27 is deposited. The semiconductor components 15 are embedded in said metallic layer 27. The panel 10 has no plastic housing composition since the metal layer 27 is arranged directly on the edge sides 20 of the semiconductor components 15.

FIG. 3 shows a plan view of the panel 10 from FIG. 2. FIG. 3 illustrates the arrangement of the semiconductor components 15 and also the arrangement of the electrodes 17, 18 on the first side 16 of the semiconductor components. The semiconductor components 15 are arranged in columns and rows and are separated from one another by means of the separating regions 22. The separating regions 22 in each case provide a sawing track. The smaller control electrode 18 is in strip form and the larger first load electrode 17 is rectangular.

Figure 4:
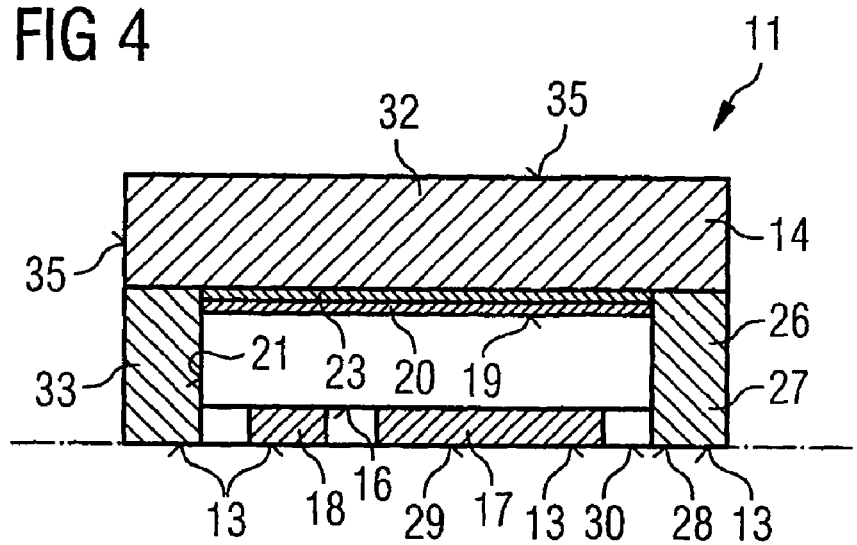
FIG. 4 shows a cross section of a semiconductor device according to a first embodiment.

FIG. 4 shows a semiconductor device 30 produced by the separation of the panel from FIGS. 2 and 3. The panel 10 is separated along the sawing tracks in the separating regions 22. This may be carried out by means of sawing by a laser. As a result, a rewiring element 31 is produced for each semiconductor component 15 and a semiconductor device is produced. The semiconductor device 30 has no plastic housing composition since the edge sides 20 and the second side 20 of the semiconductor component 15 are covered with the metal 26 of the metal layer 27 and with the plate 14. The metal layer 27 provides a sealing of the edge sides of the semiconductor component 15. The semiconductor device 30 has a rewiring element 31 extending from the second side 19 of the semiconductor component 15 as far as the first side 16. The rewiring element 31 therefore provides a rear side rewiring.

The rewiring element 31 comprises a baseplate 32, which is arranged on the second side 19 of the semiconductor component 15 and which projects beyond the edge sides 20, and comprises an edge 33, which is approximately perpendicular to the baseplate 32 and cohesively connected to the edge sides 21 of the semiconductor component 15. The rewiring element 31 therefore has a pedestal form, the inner surface of the base and of the walls being cohesively connected to the semiconductor component 15. The outer surfaces 34 of the rewiring element 31 are outer surfaces of the semiconductor device 30. The outer dimensions of the semiconductor device 30 are only somewhat greater than the outer dimensions of the semiconductor component 15. The semiconductor device 30 is a chip sized package.

The surface 29 of the first load electrode 17 and of the control electrode 18 and the surface 28 of the metal layer 27 provide the external contact areas 13 of the semiconductor device 30. Said external contact areas 13 are surface-mountable. The first load electrode 17 and the control electrode 18 have a metal layer having a thickness of above 30 µm, above 50 µm or above 100 µm. In a further embodiment (not shown), solder balls are applied on said surfaces. The solder balls provide the external contacts of the semiconductor device. In a further embodiment (not shown), the first load electrode 17 and the control electrode have copper pillars that form the external contact areas of the semiconductor device 30. The smaller control electrode 18 may have a single pillar, while the larger first load electrode 18 has a plurality of pillars.

The semiconductor device 11 is therefore a so-called "power chip sized package" (PowerCSP). The metallic sheathing provides the rewiring of the chip rear side electrode of the power MOSFET, which simultaneously serves as an external contact region. The heights of the chip front sides and of the chip rear side contact regions within said "chip sized package" can thus be coordinated precisely with one another. The coordination between separate die attach layer and front side contacts can therefore be avoided. Moreover, by means of the electrodeposited sheathing, any desired amounts of one or more metals, for example copper, can be integrated within the "power chip sized package". As a result, the thermal short- and long-time capacity of the device is flexibly set and optimized.

Figure 5:
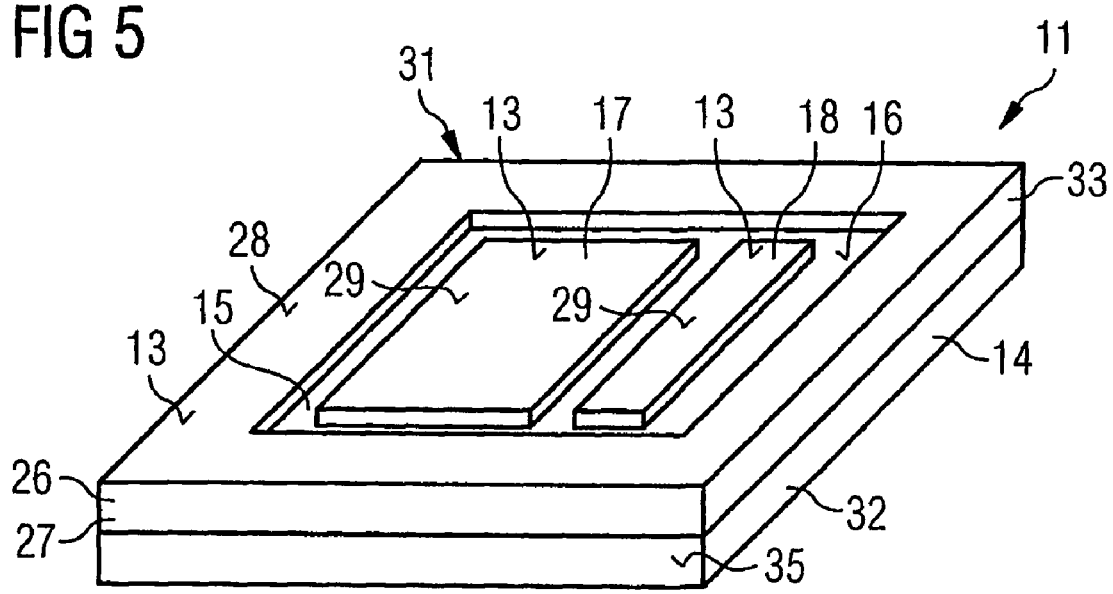
FIG. 5 shows a perspective view of the semiconductor device from FIG. 4.
Figure 6A:
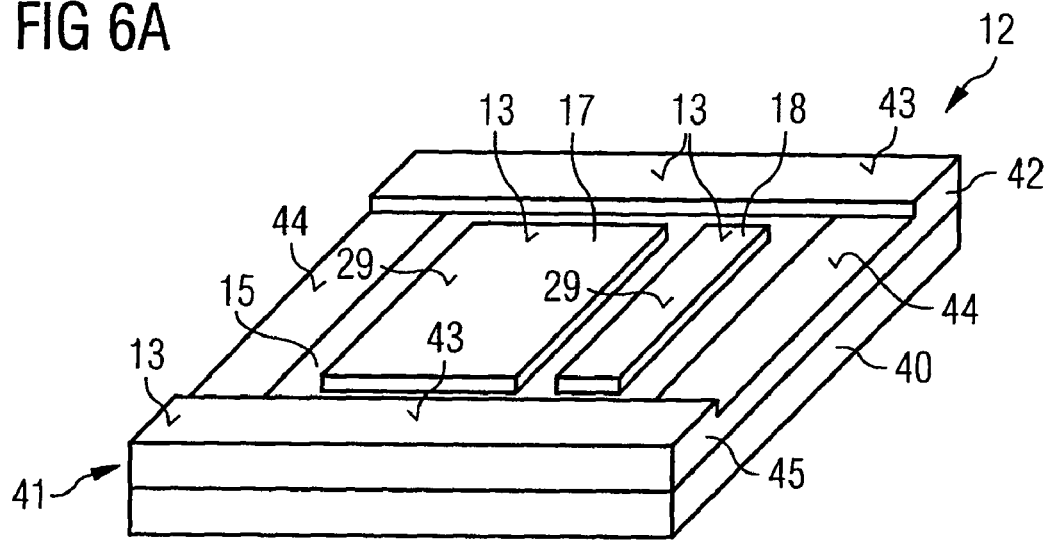
FIG. 6a shows a perspective view of a semiconductor device according to a second embodiment with a first external contact area arrangement.
Figure 6B:
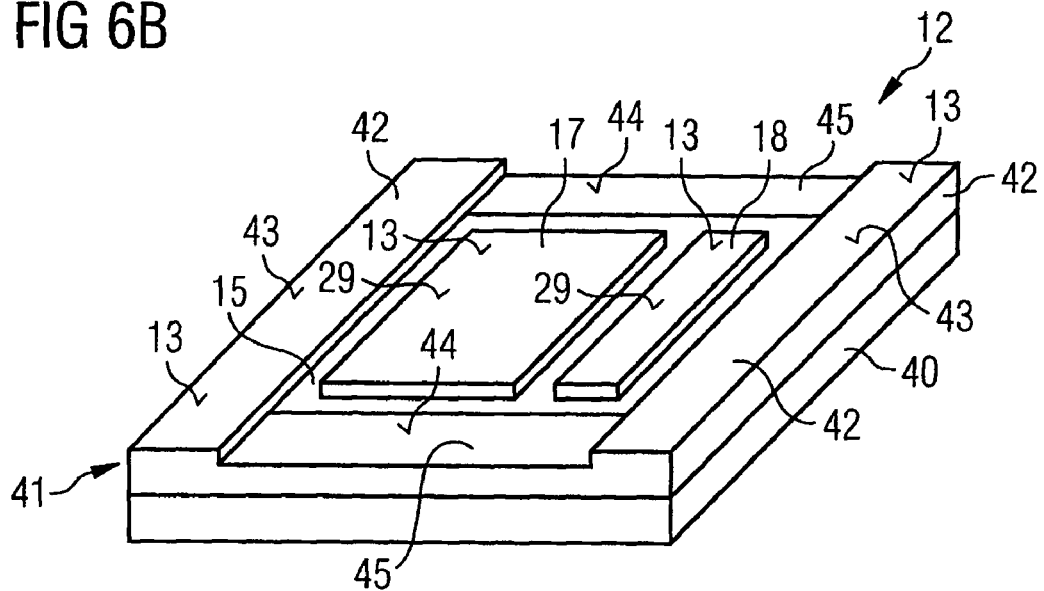
FIG. 6b shows a perspective view of a semiconductor device according to a second embodiment with a second external contact area arrangement.

FIGS. 5, 6a and 6b show three embodiments of the external contact areas 13. In FIG. 5, the surface 29 of the width of the edge or of the walls 33 of the rewiring element 31 is essentially coplanar with the outer surface 29 of the first load electrode 17 and the control electrode 18 at all four edge sides 20 of the semiconductor component 15. This common plane is shown with the reference symbol 30. The outer surface 29 of the rewiring structure 31 is therefore ring-shaped. This structure is produced during the planarization of the upper side of the panel 10. The planarization may be effected by grinding away or by setting the deposition duration. The surface 29 provides the drain terminal of the semiconductor device 11. This arrangement has the advantage that a larger contact area is provided.

Said semiconductor device 11 can be mounted on a multilayer circuit board in which the rewiring of the source electrode 17 and gate electrode 18 and the drain electrode 20 can be arranged on different planes and thereby be electrically insulated from one another. The rewiring of the source electrode 17 and the gate electrode 18 can be led under the rewiring of the outer drain electrode 20.

FIGS. 6a and 6b in each case show a semiconductor device 12 according to one embodiment, said semiconductor device having a semiconductor component 15 and a rewiring element 41. The walls 42 or the edges of the rewiring element 41 are structured, with the result that the outer surface 43 of the wall thickness 42 alongside only two opposite edge sides 20 of the semiconductor component 15 are essentially coplanar with the outer surface 29 of the first load electrode 17 and the control electrode 18. The surfaces 44 of the remaining two sides 45 of the rewiring element 41 lie in a plane below the surface 43 and therefore do not provide an external contact area. The surfaces 43 of the two opposite walls 42 provide external contact areas, in particular the drain terminal.

The rewiring element 41 has a U-shape in which the two opposite higher sides 42 provide the legs of the U-shape. The source electrode contact area 17 and the gate electrode contact area 18 are in each case in strip form.

In the embodiment of FIG. 6a, the longitudinal sides of the higher edge sides 42 of the rewiring element 41 are approximately perpendicular to the longitudinal sides of the strip-type source electrode contact area 17 and gate electrode contact area 18.

In contrast thereto, in the embodiment of FIG. 6b, the longitudinal sides of the higher edge sides 42 of the rewiring element 41 are arranged approximately parallel to the longitudinal sides of the strip-type source electrode contact area 17 and gate electrode contact area 18. This arrangement enables a plurality of semiconductor devices to be electrically coupled in parallel with one another since the semiconductor devices 12 can be mounted alongside one another on strip-type contact areas on the circuit board. The strip-type contact areas on the circuit board in each case provide a common contact for a type of semiconductor device contact area. By way of example, the source contact area of a plurality of semiconductor devices is mounted on a single strip-type contact area on the circuit board, which provides a common supply contact.

This semiconductor device 12 from FIG. 6a and FIG. 6b can be mounted on a single-layer circuit board since it is possible to lead the rewiring of the first load electrode 17 and of the control electrode 18 on the surface of the circuit board under the two short edge sides 42 of the rewiring element 41, since said short edge sides 42 are not in contact with the circuit board.

The semiconductor device 12 with an external contact area arrangement according to FIG. 6a or FIG. 6b is also produced by the production of a panel 10 as described above. After the deposition of the metal layer 27, the surface of the metal layer 27 is structured in order to produce strip-type elevated regions at two opposite edge sides 20 of the semiconductor components 15 of the panel 10. In one embodiment, the metal layer 27 is deposited with a thickness such that the surface 28 of the metal layer is essentially coplanar with the surface 29 of the first load electrode 17 and the control electrode 18. In a further step, the deposited metal layer can be planarized.

A mask is then applied and structured so as to leave free the surface 28 alongside two opposite sides of the respective semiconductor components of the panel 10. These uncovered regions are etched and the depressions produced in the process extend in each case between two adjacent semiconductor components. After the removal of the mask, strip-type elevations and depressions in the surface of the metal layer 27 of the panel 10 are uncovered. After the sawing along the sawing tracks, semiconductor devices 12 are produced which in each case have a U-shaped rewiring element 41 comprising a baseplate 40 composed of the carrier 14 and two opposite edges.

FIGS. 7 and 8 in each case show a panel 10 according to a third and fourth exemplary embodiment, respectively.

The panel 50 from FIG. 7 differs from the panel 10 from FIGS. 1 to 6 by virtue of the carrier 14 and the construction of the external contact areas 13. The carrier 14 has a lower ceramic substrate 51 and an upper metallic layer 52, in particular a copper layer. The carrier 14 is a so-called DCB substrate, a direct copper bond substrate. The panel 50 is produced in the manner already described above. The semiconductor components 15 are mounted on the top side 24 of the copper layer 52 by means of a diffusion solder connection 23. A metal layer 27 is electrodeposited onto the carrier 50 into the separating regions 22. In this embodiment, the external contact areas 13 of the panel 50 have a layer 53 composed of a solder-wettable material and a soft solder layer 54. The solder-wettable layer 53 is arranged on the surface 28 of the metal layer and also on the surface 29 of the first load electrode 17 and the control electrode 18. The solder layer 54 is arranged on the solder-wettable layer 53. The solder-wettable layer 53 essentially comprises Ni-2% P. The solder-wettable layer 53 may have Ni. The solder layer 54 may have an Sn-based soft solder, a lead-free solder or a diffusion solder, such as Sn—Ag, Au—Sn or In—Ag. A diffusion solder layer may have a plurality of layers.

The solder-wettable layer 53 and the solder layer 54 are deposited onto the panel. This may be carried out galvanically or by means of sputtering or vapor deposition.

In an embodiment that is not shown, a carrier 14 is provided which has a ceramic plate coated with a metallic layer on the two large-area sides. Said carrier can be produced by means of a so-called "direct copper bond" method. The outer surface of the baseplate of the rewiring element of the semiconductor device is a metallic layer. An additional heat sink can be mounted on said surface in a simple manner without the heat sink being electrically connected to the second load electrode 20.

The metallic layer of the carrier 14 may be provided by other electrically conductive materials, such as carbon for example.

FIG. 8 shows a cross section of a panel 60 according to the fourth embodiment. The panel 60 differs by virtue of the structure of the edge sides 20 of the semiconductor component 15 and also the structure of the metal layer 27. The edge sides 20 of the semiconductor components 15 in each case have an electrically insulating layer 61 produced by the oxidation of the surface of the edge sides 20. The electrical insulation of the metal layer 27 from the semiconductor material of the body of the semiconductor component 15 is thereby increased.

The metal layer 27 additionally has a seed layer 63 arranged onto the surface 24 of the plate 14 and also on the surface of the insulation layer 62. The seed layer 63 may be applied by means of sputtering, vapor deposition or galvanically or chemically. A seed layer may be used in order to increase the adhesion between the plate and the metal layer 27 and/or between the edge sides 20 of the semiconductor component 15 and the metal layer.

FIGS. 9 to 11 show a panel 70 according to a fifth embodiment. In this embodiment, the panel 70 has a baseplate or a carrier in the form of a rear side metallization. The panel 70 also differs by virtue of its size, which corresponds approximately to the size of the semiconductor wafer from which the semiconductor components are separated.

FIGS. 12 to 17 show devices with semiconductor components 15 which are produced by means of the panel 70.

FIG. 9 shows a panel 70 having a semiconductor wafer 71 with a rear side metallization 72, which serves as a baseplate. The semiconductor wafer 71 has a multiplicity of semiconductor component positions 73 which are in each case doped correspondingly and have a front side metallization 74, with the result that each position 73 provides a semiconductor component 15. In this embodiment, each device position 73 provides a vertical power MOSFET. The semiconductor component positions 73 are arranged in columns and rows and separated from adjacent semiconductor component positions 73 by means of sawing tracks 81. The sawing tracks 81 are represented by a broken line.

The front side metallization 74 provides a first load electrode 17 and a control electrode 18, which are electrically insulated from one another by means of a passivation layer 75. The rear side 76 of the semiconductor wafer 71 has a metal layer 77 extending over the entire rear side 76. The metal layer 77 simultaneously forms the rear side metallization 72 and a carrier. The components 15 of the semiconductor component positions 73 are therefore electrically connected to the rear side metallization 72 and the metal layer 77. The rear side metallization 72 is deposited onto the wafer. The rear side metallization may have a known composition and may have a known layer sequence composed of different metals.

In contrast to the exemplary embodiments of FIGS. 1 to 8, the second sides 19 of the semiconductor component positions 73 are directly connected to the metal layer 77 and are not mounted on the metal layer 77 or on the carrier by means of an additional layer, such as soft solder or diffusion solder.

The semiconductor components 15 are separated from the semiconductor wafer 71 by means of a laser. This is shown schematically by the arrows. The separating lines are arranged in the sawing tracks 81. As illustrated in FIG. 10, the semiconductor components 15 are separated from the semiconductor wafer 71 from the top side 78 of the semiconductor wafer 71 in such a way that the metal layer 77 is not cut. The first metal layer 77 extends between singulated semiconductor components 15. The multiplicity of semiconductor components 15 is therefore arranged on a single first metal layer 77 and electrically connected to said first metal layer 77. The metal layer 77 therefore provides a carrier. The edge sides 21 of adjacent semiconductor components 15 are separated from one another by means of separating regions 79 having a width B. The surface 81 of the metal layer 77 is uncovered in the separating regions 79.

A second metallic layer 80 is electrodeposited in the separating regions 79 between adjacent semiconductor components 15 as described above. This method is illustrated in FIG. 11. The separating regions 79 are filled by the second metallic layer 80, with the result that the second metallic layer 80 has a thickness which at least approximately corresponds to the height of the semiconductor component 15. After the deposition, the surface 86 of the metallic layer 80 may exceed the surface of the first side 78 of the semiconductor wafer 71 or the surface of the front side metallization 78. The surface 86 is then planarized, with the result that the surface 87 of the second metallic layer 80 and the surface of the first load electrode and the control electrode are essentially coplanar.

The rear side metallization 72 and the second metallic layer 80 provide a rear side rewiring, with the result that the second load electrode 20 on the rear side 19 of the semiconductor components 15 can be acted on electrically from the top side 16 of the semiconductor component 15. The metal of the rear side metallization 72 may be the metal of the deposited second metallic layer 80. As an alternative, the second metallic layer 80 and the rear side metallization may have different metals. The rear side metallization may have copper or aluminum, for example, and the second electrodeposited layer may have Au, Au, Sn, Ni, Ag, Al, Cu or An-Ag, for example.

The panel 70 therefore has a metal layer 77 formed from the rear side metallization 72, and a multiplicity of semiconductor components 15 embedded in the second deposited metallic layer 80. The areal size of the panel 70 corresponds to the size of the semiconductor wafer 71.

The panel 70 is separated along the sawing tracks 81. The sawing tracks are arranged in the separating regions 79 which are filled by the second metallic layer 80. The second metallic layer 80 is therefore separated. The separation is carried out in such a way that after the separation, a layer 82 of the second metallic layer 80 remains on the edge sides 21 of the semiconductor components 15. The width of the second sawing track 81b is narrower than the width B of the separating regions 79. The singulation of the semiconductor components 15 from the panel 70 in order to produce semiconductor devices 83 may be carried out by means of a laser or by means of sawing.

The method for the production of a rear side rewiring by electrodeposition at the wafer level is suitable for power semiconductors, which are becoming thinner and thinner, so that it is perfectly conceivable for the semiconductor to make up only a fraction of the metallization thickness. Since the method enables two or more semiconductors lying alongside one another on a metallization to be introduced into the housing as one device, which has the consequence of identical electrical properties of the semiconductors, high-precision filters, trimming circuits and amplifiers, for example, can be realized by means of this method. Electrical circuits in which identical electrical properties are required have hitherto been realized with sorted individual devices, which is complicated and expensive.

Figure 12:
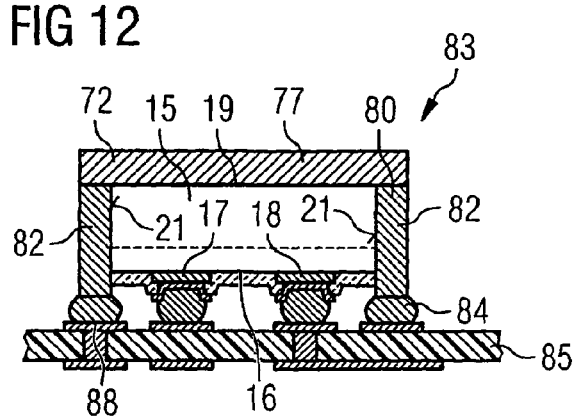
FIG. 12 shows a semiconductor device according to a sixth embodiment.

FIG. 12 shows a semiconductor device 83 according to a sixth exemplary embodiment, which is singulated from the panel 70 from FIG. 11. The semiconductor device 83 has a vertical semiconductor component 15 with a front side metallization 79 and a rear side rewiring 84 having a first metallic layer 77 and a second metallic layer 82. The first metallic layer is arranged on the rear side or on the second side 19 of the semiconductor component 15. The second metallic layer 82 is arranged on the edge sides 21 of the semiconductor component 15 and cohesively connected to the edge sides. The surface 86 of the second metallic layer 82 provides the external contact area of the second load electrode 20 in an exemplary embodiment that is not shown.

The semiconductor device 83 furthermore has external contacts 84, which are solder balls in this embodiment. The semiconductor device 83 is mounted onto a circuit carrier 85, which may be a circuit board for example, by means of the external contacts. The circuit carrier 85 may be an organic or ceramic substrate, silicon or a semiconductor chip. The external contacts 84 are arranged on the first load electrode 17, on the control electrode 18 and also on the surface 86 of the second metallic layer 82.

A semiconductor device is also provided which has at least two semiconductor components. At least one of the semiconductor components 15 has a metallic sheathing 91 which completely covers the edge sides 21 and the second side 19 and partly covers the first side.

In an embodiment that is not shown, an insulation and/or passivation layer is arranged between the metallic sheathing 81 and the semiconductor component material.

The metallic sheathing may form a shielding against electromagnetic interference fields, be operatively connected to a heat sink or form a connecting element for electrically connecting a rear side electrode of the semiconductor chip to an external contact of the semiconductor chip on the top side.

Figure 13:
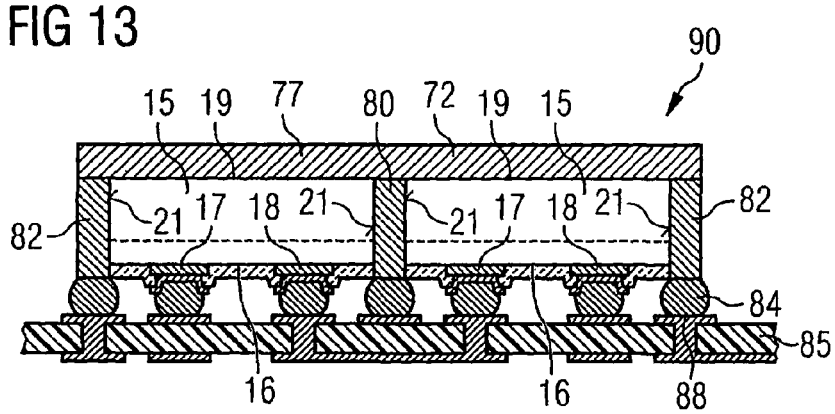
FIG. 13 shows a semiconductor device according to a seventh embodiment.

FIG. 13 shows a semiconductor device 90 according to a seventh embodiment, which has two semiconductor components 15, each of which is a vertical power semiconductor component. The two semiconductor components 15 are arranged alongside one another. A single first metallic layer 77 extends between the two semiconductor components 15 and projects beyond the outer edges of the rear sides of the two semiconductor components. The semiconductor device 90 also has a second metallic layer 80 which covers the edge sides 21 of the two semiconductor components and fills the separating region 79 between the semiconductor components 15. The edge sides 21 of the two semiconductor components 15 are embedded in a common second metallic layer 80.

In this embodiment, at least two semiconductor components 15 have a common metallic sheathing which completely covers the edge sides 21 and the second side 19 and partly covers the first side 16 of said semiconductor components 15.

The second metallic layer 80 electrically connects the second load electrodes 20 of the two semiconductor components 15 to one another. In this embodiment, the surface of the second metallic layer 80 is approximately coplanar with the surface of the front side metallization 78. The surface 86 of the second metallic layer 80 therefore has an outer rectangular ring and a centrally arranged strip extending between two opposite sides of the ring.

The first load electrodes 17, the control electrodes 18 and regions 86 of the sheathing which are essentially coplanar with the first load electrode 17 and the control electrode 18 form external contact areas 87 of the semiconductor device. Said external contact areas 87 may be surface-mountable external contacts. Said external contact areas 87 can be electrically connected to a printed circuit board or a circuit board 85 by means of contact elements 84 such as solder balls, flip-chip contacts or bonding wires. The material of the contact areas 87 is chosen correspondingly depending on the type of contact-making.

The semiconductor device 90 having two semiconductor components 15 arranged alongside one another can be produced by means of the panel according to FIG. 11. In order to produce the semiconductor device 90, the panel 70 is separated in a first direction through every second sawing track 81 and is separated in a second direction, which is perpendicular to the first direction, into each sawing track 81. The semiconductor device 90 with two semiconductor components 15 arranged alongside one another, which is illustrated in FIG. 13, is produced in this way. The panel 70 can also be separated in order to produce semiconductor devices having more than two semiconductor components 15.

Figure 14:
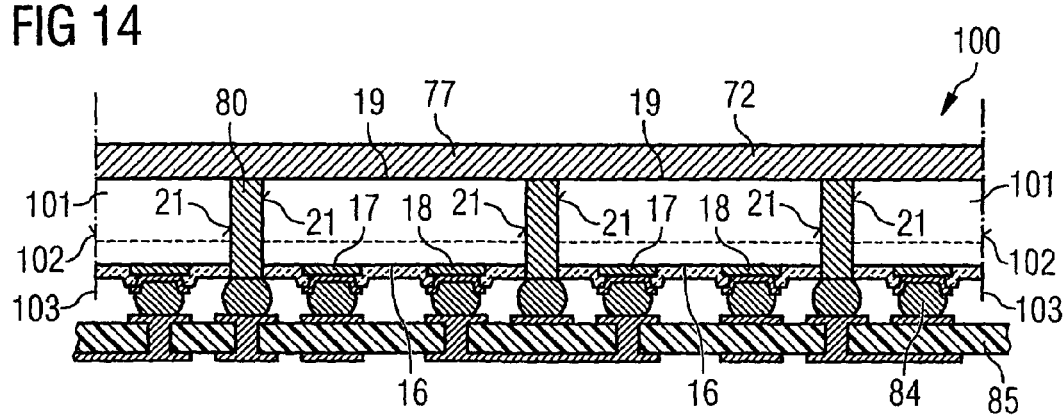
FIG. 14 shows a semiconductor device according to an eighth embodiment.

FIG. 14 shows a semiconductor device 100 according to an eighth embodiment, which has two semiconductor components 15 and also two additional semiconductor bodies 101. One of the two additional semiconductor bodies 101 is arranged alongside an outer edge side 21 of one of the two semiconductor components 15. The semiconductor bodies 101 are in each case a part of a semiconductor component 15 which has been produced by sawing from a semiconductor component 15 of the semiconductor wafer 71. An outer edge side 102 of the semiconductor body is therefore free from the second metallic layer 80 since this surface was originally situated within the semiconductor bodies of the semiconductor component 15. The rear side 19 of the semiconductor bodies 101 is covered with the metal layer 77 of the rear side metallization 71 and the further inner edge sides 21 are embedded in the second metallic deposited layer 80.

The device 101 is separated from the wafer in sawing tracks 103 which are arranged within the area of a semiconductor component 15. This has the advantage that the sawing tolerances are enlarged since the saw blade does not have to fit within the narrow first separating region 79. Consequently, a wider saw blade can be used and the sawing can be carried out more reliably. Larger deviations in the positioning of the saw blade can also be afforded tolerance without the semiconductor device 101 being damaged.

FIG. 15 and FIG. 16 show a semiconductor device 110 according to a ninth embodiment, which has two stacked semiconductor devices 83, 111. FIG. 15 shows a cross section and FIG. 16 a plan view of the semiconductor device 110.

The lower semiconductor device 83 has a metal coating on the rear side 19 and on the edge sides 21 of the semiconductor component 15, which metal coating is formed from the rear side metallization 71 and the second metallic layer 80. The semiconductor device 83 according to the exemplary embodiment of FIG. 12 may be the lower semiconductor device 83 of the stack. Semiconductor devices according to further exemplary embodiments described herein may also be used instead of said device 83.

The upper semiconductor device 111 has a front side 112 with contact areas 113, but no metal coating on the rear side 19 and on the edge sides 21 of the semiconductor component.

The rear side 114 of the semiconductor device 83 is arranged on a system carrier 85. The top side 115 of the semiconductor device 83 is remote from the system carrier. The upper semiconductor device 111 is arranged on the top side 115 of the lower semiconductor device 83 by means of solder balls 84. The solder balls 84 are arranged directly between the contact areas 113 of the upper semiconductor device 111 and the contact areas 17, 18 or the surface 87 of the second metallic layer 82 of the lower semiconductor device 83. The upper semiconductor device 111 is therefore electrically connected to the lower semiconductor device 83 by means of the solder balls 84.

The plan view of the semiconductor device 110, which can be seen in FIG. 16, shows that the lower semiconductor device 83 is rectangular and the upper semiconductor device 111 is square. The length of the sides of the upper semiconductor device is approximately the length of the short side of the lower semiconductor device 83. The outer regions 116, 117 of the two opposite sides of the lower semiconductor device 83 are therefore not covered by the upper semiconductor device 111. The uncovered outer regions 116, 117 of the first side or front side 16 have contact areas 118 which are freely accessible. The lower semiconductor device 83 is electrically connected to the circuit carrier 85 by means of bonding wires 119 extending between the contact areas 118 of the front side 16 of the lower semiconductor device 83 and contact areas 88 of the circuit carrier 85.

FIG. 17 shows a semiconductor device 120 according to a tenth embodiment, which has a single semiconductor component 15. The rear side 19 and the edge sides 21 of the semiconductor component 15 are sheathed with a metal coating 121 formed from the rear side metallization 72 and the second deposited metallic layer 80.

The rear side 19 is mounted on a circuit carrier 85 by means of the metallic layer 77 of the rear side metallization 72. The rear side 19 can be mounted on a heat sink. The heat dissipation from the semiconductor component 15 into the heat sink is improved owing to the metallic sheathing 121. The contact areas 17, 18 and also the metallic coating 121 are electrically connected to contact areas 88 of the circuit carrier 85 by means of bonding wires 122. The surfaces 87 of the edge layers 82 of the second deposited metallic layer 80 may serve as contact areas. As an alternative, contact areas of a different material may be provided on the surface 87. Said material is selected so as to produce an improved contact to the material of the bonding wire. Said semiconductor device 120 provides an improved dissipation of heat for applications in which no chip island is available.

LIST OF REFERENCE SYMBOLS

10 Panel
11 First semiconductor device
12 Second semiconductor device
13 External contact areas
14 Carrier
15 Semiconductor component
16 First side
17 First load electrode
18 Control electrode
19 Second side
20 Second load electrode
21 Edge side
22 Separating region
23 Diffusion solder connection
24 Surface of the carriers
25 Rear side rewiring
26 Metal
27 Metallic layer
28 Surface of the metallic layer
29 Surface of the first load electrode and control electrode
30 Common plane
31 Rewiring element
32 Baseplate
33 Edge
34 Surface of the rewiring element
40 Baseplate
41 Second rewiring element
42 Edge of the second rewiring element
43 Surface of two sides of the second rewiring element
44 Surface of the remaining two sides of the second rewiring element
45 Edge
50 Second panel
51 Ceramic substrate
52 Upper metallic layer
53 Solder-wettable layer
54 Solder layer
60 Third panel
61 Insulating layer
62 Seed layer
70 Panel
71 Semiconductor wafer
72 Rear side metallization
73 Device position
74 Front side metallization
75 Passivation layer
76 Rear side of the semiconductor wafer
77 Metal layer
78 Top side of the semiconductor wafer
79 Separating region
80 Second electrodeposited layer
81 Sawing track
82 Edge layer
83 Semiconductor device
84 External contact
85 Circuit carrier
86 Surface of the second metallic layer
87 External contact area
88 Contact area of the circuit carrier
90 Semiconductor device
100 Semiconductor device 101 Semiconductor body
102 Outer edge side of the semiconductor body
110 Semiconductor device
111 Stacked semiconductor device
112 Front side of the stacked semiconductor device
113 Contact area
114 Rear side of the stacked semiconductor device
115 Top side of the lower semiconductor device
116 Uncovered region of the lower semiconductor device
117 Uncovered region of the lower semiconductor device
118 Contact area of the lower semiconductor device
119 Bonding wire
120 Semiconductor device
121 Metallic coating
122 Bonding wire

The invention claimed is:

1. A panel, comprising:
a baseplate with an upper first metallic layer; and
a multiplicity of semiconductor components, wherein the semiconductor components in each case comprise a first side with a first load electrode and a control electrode and an opposite second side with a second load electrode,
wherein the second side of the semiconductor components is in each case mounted on the metallic layer of the baseplate and the semiconductor components are arranged in such a way that edge sides of adjacent semiconductor components are separated from one another, and wherein a second metallic layer is arranged in separating regions between the semiconductor components,
wherein at least regions of the surface of the second metallic layer are essentially coplanar with the first load electrode and the control electrode, and
wherein said regions are arranged at four opposite edge sides of the respective semiconductor components.

2. The panel as claimed in claim 1, wherein the second metallic layer extends between edge sides of adjacent semiconductor components.

3. The panel as claimed in claim 1, wherein the separating regions between adjacent semiconductor components are essentially filled by the second metallic layer.

4. The panel as claimed in claim 1, wherein the second load electrode of the semiconductor components is mounted on the metallic layer of the plate by means of a soft solder connection or a diffusion solder connection.

5. The panel as claimed in claim 1, wherein the semiconductor components are in each case a MOSFET or an IGBT or a BJT.

6. The panel as claimed in claim 1, wherein the baseplate of the rewiring element is a metal plate.

7. The panel as claimed in claim 1, wherein the baseplate of the rewiring element is formed from an electrically insulating substrate with a metallic coating.

8. The panel as claimed in claim 7, wherein the metallic coating is arranged on two sides of the electrically insulating substrate.

9. The panel as claimed in claim 7, wherein the metallic coating is arranged only on one side of the electrically insulating substrate.

10. The panel as claimed in claim 7, wherein the baseplate is a ceramic substrate with a DCB layer.

11. A panel, comprising:
a baseplate comprising a first metallic layer; and
a plurality of semiconductor components, wherein each of the semiconductor components comprises a first side on which a first load electrode and a control electrode are disposed, and an opposite second side on which a second load electrode is disposed,
wherein the second side of each of the semiconductor components is disposed on the first metallic layer and the semiconductor components are arranged in such a way that edge sides of adjacent ones of the semiconductor components are separated from one another, and wherein a second metallic layer is arranged in between the adjacent ones of the semiconductor components,
wherein a plurality of portions of the surface of the second metallic layer are each essentially coplanar with the first load electrode and the control electrode, and
wherein said portions of the surface of the second metallic layer are arranged at four opposite edge sides of the respective semiconductor components.

12. The panel as claimed in claim 11, wherein the second metallic layer extends between edge sides of adjacent semiconductor components.

13. The panel as claimed in claim 11, wherein regions between adjacent semiconductor components are essentially filled by the second metallic layer.

14. The panel as claimed in claim 11, wherein the second load electrode of the semiconductor components is mounted on the metallic layer of the plate by means of a soft solder connection or a diffusion solder connection.

15. The panel as claimed in claim 11, wherein the semiconductor components are in each case a MOSFET or an IGBT or a BJT.

16. The panel as claimed in claim 11, wherein the baseplate of the rewiring element is a metal plate.

17. The panel as claimed in claim 11, wherein the baseplate of the rewiring element comprises an electrically insulating substrate with a metallic coating.

18. The panel as claimed in claim 17, wherein the metallic coating is arranged on two sides of the electrically insulating substrate.

19. The panel as claimed in claim 17, wherein the metallic coating is arranged only on one side of the electrically insulating substrate.

20. The panel as claimed in claim 17, wherein the baseplate is a ceramic substrate with a DCB layer.

21. A panel, comprising:
a baseplate comprising a first metallic layer; and
a plurality of semiconductor components, wherein each of the semiconductor components comprises a first side on which a first load electrode and a control electrode are disposed, and an opposite second side on which a second load electrode is disposed,
wherein the second side of each of the semiconductor components is disposed on the first metallic layer, edge sides of adjacent ones of the semiconductor components are separated from one another, and a second metallic layer is arranged in between the adjacent ones of the semiconductor components,
wherein a plurality of portions of the surface of the second metallic layer are each coplanar with the first load electrode and the control electrode, and
wherein said portions of the surface of the second metallic layer are arranged at four opposite edge sides of the respective semiconductor components.

22. The panel as claimed in claim 21, wherein the second metallic layer extends between edge sides of adjacent semiconductor components.

23. The panel as claimed in claim 21, wherein regions between adjacent semiconductor components are essentially filled by the second metallic layer.

24. The panel as claimed in claim 21, wherein the second load electrode of the semiconductor components is mounted on the metallic layer of the plate by means of a soft solder connection or a diffusion solder connection.

25. The panel as claimed in claim 21, wherein the semiconductor components are in each case a MOSFET or an IGBT or a BJT.

26. The panel as claimed in claim 21, wherein the baseplate of the rewiring element is a metal plate.

27. The panel as claimed in claim 21, wherein the baseplate of the rewiring element comprises an electrically insulating substrate with a metallic coating.

28. The panel as claimed in claim 27, wherein the metallic coating is arranged on two sides of the electrically insulating substrate.

29. The panel as claimed in claim 27, wherein the metallic coating is arranged only on one side of the electrically insulating substrate.

30. The panel as claimed in claim 27, wherein the baseplate is a ceramic substrate with a DCB layer.

* * * * *